United States Patent [19]
Lopatin

[11] Patent Number: 6,127,282
[45] Date of Patent: *Oct. 3, 2000

[54] METHOD FOR REMOVING COPPER RESIDUE FROM SURFACES OF A SEMICONDUCTOR WAFER

[75] Inventor: Sergey Lopatin, Santa Clara, Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/190,768

[22] Filed: Nov. 12, 1998

[51] Int. Cl.$^7$ .............................. H01L 21/302; B08B 3/00
[52] U.S. Cl. ............................................... 438/754; 134/28
[58] Field of Search .................... 438/754, 745; 134/28

[56] References Cited

U.S. PATENT DOCUMENTS

| | | | |
|---|---|---|---|
| 4,239,661 | 12/1980 | Muraoka et al. | 252/541 |
| 4,885,056 | 12/1989 | Hall et al. | 156/662 |
| 4,964,919 | 10/1990 | Payne | 134/2 |
| 5,259,888 | 11/1993 | McCoy | 134/2 |
| 5,354,712 | 10/1994 | Ho et al. | 437/195 |
| 5,498,293 | 3/1996 | Ilardi et al. | 134/3 |
| 5,509,970 | 4/1996 | Shiramizu | 134/3 |
| 5,896,870 | 4/1999 | Huynh et al. | 134/1.3 |

OTHER PUBLICATIONS

Wolf et al., Silicon Processing for the VLSI Era, vol. 1: Process Technology, Lattice Press, Sunset Beach, Calif., USA, pp. 514–517, 1986.

S. Lopatin, Y. Shacham–Diamand, V. Dubin, P.K. Vasudev, and J. Pellerin, and B. Zhao, *Electroless CoWP Barrier/ Protection Layer Deposition for Cu Metallization*, Mat. Res. Soc. Symp. Proc., vol. 451, 1997, Materials Research Society, pp. 463–468.

V.M. Dubin, E.H. Adem, J. Bernard, D. Schonauer, and J. Bertrand, *Cleaning in Cu Metallization Technology*, Conference Proceedings ULSI XIII, 1998, Materials Research Society, pp. 421–426.

*Primary Examiner*—Benjamin L. Utech
*Assistant Examiner*—Matt Anderson
*Attorney, Agent, or Firm*—Monica H. Choi

[57] ABSTRACT

A method for effectively removing copper residue from surfaces of a semiconductor wafer includes the step of immersing the semiconductor wafer having the copper residue into an acidic solution and then into a basic cleaning solution. The acidic solution includes hydrogen fluoride (HF) and hydrogen chloride (HCl) for breaking bonds within the copper residue which may include for example dicopper oxide ($Cu_2O$), copper oxide (CuO), and organic copper residue such as copper benzotriazole (Cu-BTA complex). The basic cleaning solution includes tetramethylammonium hydroxide (($CH_3)_4$NOH) and surfactant (RE-610) for effectively acting as an emulsifier to rinse away the copper residue having broken bonds from the semiconductor wafer. The present invention may be practiced to particular advantage when the semiconductor wafer is immersed in deionized water after immersion in the acidic solution and after immersion in the basic cleaning solution.

20 Claims, 3 Drawing Sheets

METHOD FOR REMOVING COPPER RESIDUE FROM SURFACES OF A SEMICONDUCTOR WAFER

TECHNICAL FIELD

This invention relates to metallization during fabrication of integrated circuits, and more particularly, to a method for efficiently removing unwanted copper residue from surfaces of a semiconductor wafer.

BACKGROUND OF THE INVENTION

As the width of metal lines are further scaled down to submicron and nanometer dimensions, electromigration failure and joule heating may lead to integrated circuit failure. Thus, copper which has lower bulk resistivity, higher melting point, and higher heat conductivity than aluminum is considered more viable for fine line metallization.

Referring to FIGS. 1A and 1B, FIG. 1A shows a top view of a copper line 10, and FIG. 1B shows a cross sectional view of the copper line 10 of FIG. 1A along line AA. Because copper is not a volatile metal, copper cannot be easily etched away in a deposition and etching process as typically used for aluminum metallization. Thus, the copper line 10 is typically formed by etching a trench 12 as an opening within a trench insulating layer 14. The trench 12 is then filled with copper to form the metal line 10.

The trench insulating layer 14 is typically a silicon dioxide layer that is formed on a silicon substrate 16. However, the present invention may be practiced when copper is also formed in any other type of trench insulating layer that is formed on any other type of semiconductor material, as would be apparent to one of ordinary skill in the art from the description herein.

Referring to FIG. 1C, the copper line 10 is part of a larger integrated circuit that is fabricated within a semiconductor wafer 18. After the trench 12 is filled with copper, the surface of the semiconductor wafer 16 is polished with a chemical mechanical polish to confine the copper to be contained within the trench 12, as known to one of ordinary skill in the art of integrated circuit fabrication.

Referring to FIG. 1A, after the chemical mechanical polish of the semiconductor wafer 16, copper residue 20 remains on the surfaces of the semiconductor wafer 16. The copper residue 20 includes any one of dicopper oxide ($Cu_2O$), copper oxide (CuO), and an organic copper complex such as copper benzotriazole (Cu-BTA) that results from copper deposition and polishing processes having organic solvents.

Some of the copper residue 20 remains on the back-side of the semiconductor wafer 18. Some of the copper residue 20 becomes ingrained into the top surface of the silicon dioxide trench insulating layer 14 after the chemical mechanical polish of the semiconductor wafer 18. Some of the copper residue 20 remains on top of the copper line 10.

In any case, such copper residue may adversely affect the circuit performance of the integrated circuit within the semiconductor wafer 18. For example, the copper residue 20 ingrained into the silicon dioxide trench insulating layer 14 degrades the insulating property of the silicon dioxide trench insulating layer 14. The copper residue 20 on the backside of the semiconductor wafer 16 may alter the properties of the semiconductor substrate 16 by introducing impurities into the semiconductor substrate 16. The copper residue 20 on top of the copper line 10 may prevent a good metal contact of a via plug to the top of copper line 10 having the copper residue 20.

In the prior art, a process for removing the copper residue 20 included rinsing the semiconductor wafer 18 in deionized water after a chemical mechanical polish. However, such a rinsing process does not adequately remove the copper residue 20 from surfaces of the semiconductor wafer 18.

SUMMARY OF THE INVENTION

Accordingly, a primary object of the present invention is to more effectively remove copper residue from surfaces of a semiconductor wafer.

In a general aspect of the present invention, a method for removing copper residue from surfaces of a semiconductor wafer includes immersing the semiconductor wafer in two solutions. The method of the present invention includes a step of immersing the semiconductor wafer in an acidic solution that includes hydrogen fluoride (HF) and hydrogen chloride (HCl). The hydrogen fluoride has a concentration in the acidic solution in the range of from about 50 ml/l to about 500 ml/l. The hydrogen chloride has a concentration in the acidic solution in the range of from about 1 ml/l to about 20 ml/l. The semiconductor wafer is immersed in the acidic solution to break bonds in the copper residue. In addition, the method of the present invention includes a step of immersing the semiconductor wafer in a basic cleaning solution that includes tetramethylammonium hydroxide (($CH_3)_4NOH$) and a surfactant (RE-610). The tetramethylammonium hydroxide (($CH_3)_4NOH$) has a concentration in the cleaning solution in the range of from about 5 g/l to about 100 g/l. The surfactant (RE-610) has a concentration in the cleaning solution in the range of from about 0.01 g/l to about 0.10 g/l. The semiconductor wafer is immersed in the cleaning solution for removal of the copper residue having broken bonds after the semiconductor wafer has been immersed in the acidic solution.

The present invention may be used to particular advantage when the hydrogen fluoride (HF) in the acidic solution breaks bonds of the copper residue ingrained within a silicon dioxide layer by etching the top surface of the silicon dioxide layer. In addition, the hydrogen fluoride and the hydrogen chloride in the acidic solution break bonds in the dicopper oxide, copper oxide, and organic copper residue.

Furthermore, the present invention may be used to particular advantage when the semiconductor wafer is immersed in the acidic solution for a time duration in the range of from about 3 seconds to about 15 seconds and/or with a temperature of the acidic solution being in the range of from about 15° C. to about 75° C. and/or with the acidic solution having a pH in the range of from about 1 to about 5.

Additionally, the present invention may be used to particular advantage when the semiconductor wafer is immersed in the cleaning solution for a time duration in the range of from about 1 minute to about 3 minutes and/or with a temperature of the cleaning solution being in the range of from about 15° C. to about 95° C. and/or with the cleaning solution having a pH in the range of from about 7 to about 14.

In other aspects of the present invention, the method of the present invention may include the further steps of immersing the semiconductor wafer in deionized water after immersing the semiconductor wafer in the acidic solution and after immersing the semiconductor wafer in the cleaning solution.

By first breaking the bonds of the copper residue with an acidic solution and then by rinsing away the copper residue having broken bonds with a basic cleaning solution, the copper residue is effectively removed from the semiconductor wafer.

BRIEF DESCRIPTION OF THE DRAWINGS

The figures referred to herein are drawn for clarity of illustration and are not necessarily drawn to scale. Elements having the same reference number in FIGS. 1, 2, 3, 4, and 5 refer to elements having similar structure and function.

DETAILED DESCRIPTION

Figure 1A:
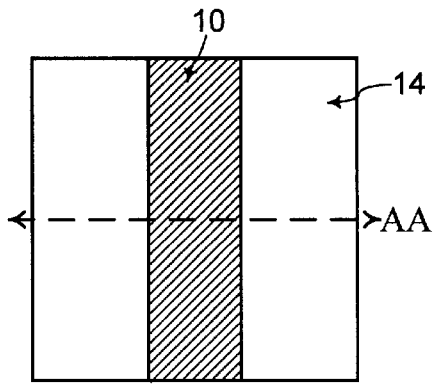
FIG. 1A is a top view of a copper metal line within an insulator.
Figure 1B:
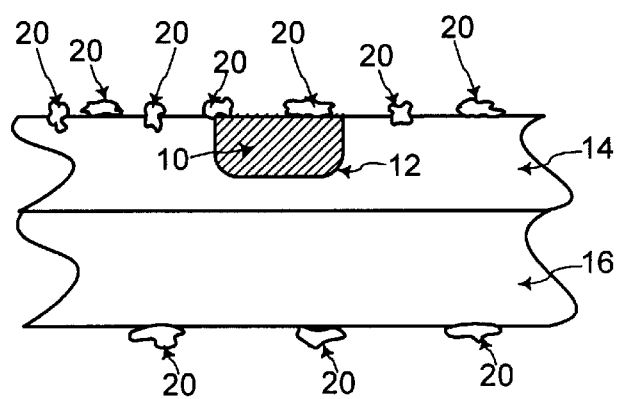
FIG. 1B is a cross-sectional view of the copper metal line of FIG. 1A.
Figure 1C:
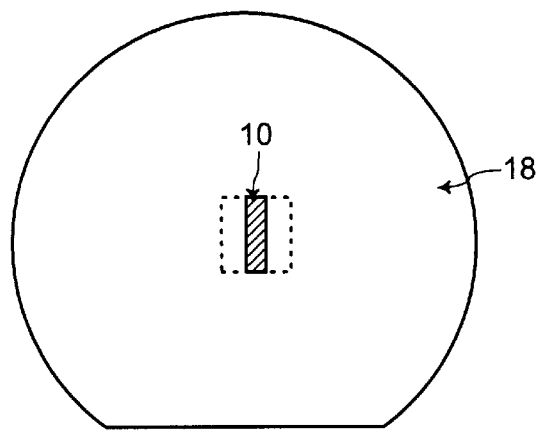
FIG. 1C illustrates the copper metal line of FIGS. 1A and 1B as part of a semiconductor wafer.
Figure 2:
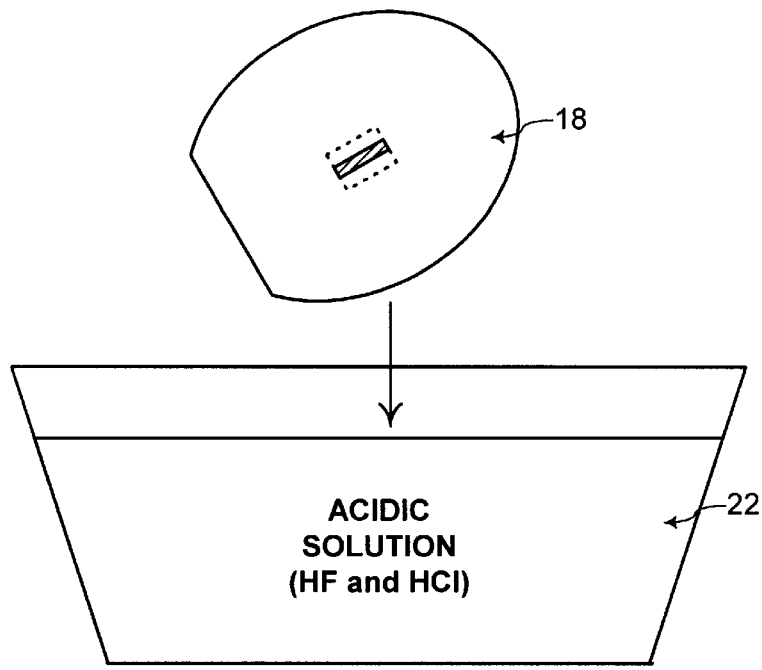
FIG. 2 shows the semiconductor wafer being immersed into an acidic solution having special components for breaking bonds within the copper residue on the semiconductor wafer, according to the present invention.

Referring to FIG. 2, the semiconductor wafer 18 having the copper residue 20 is first immersed into an acidic solution 22. The acidic solution 22 includes hydrogen fluoride (HF) and hydrogen chloride (HCl) to break the bonds within the copper residue 20 on the semiconductor wafer 18. The hydrogen fluoride has a concentration in the acidic solution 22 in the range of from about 50 ml/l to about 500 ml/l. The hydrogen chloride has a concentration in the acidic solution 22 in the range of from about 1 ml/l to about 20 ml/l. The solvent of the acidic solution 22 is water ($H_2O$).

The hydrogen fluoride in the acidic solution 22 breaks bonds of the copper residue ingrained within the silicon dioxide layer 14 by etching the top surface of the silicon dioxide layer 14. In addition, the hydrogen fluoride and the hydrogen chloride in the acidic solution 22 breaks bonds in dicopper oxide ($Cu_2O$), copper oxide (CuO), and organic copper residue such as copper benzotriazole (Cu-BTA complex), within the copper residue 20.

In addition, the semiconductor wafer 18 is immersed in the acidic solution 22 preferably for a time duration in the range of from about 3 seconds to about 15 seconds. The temperature of the acidic solution 22 preferably is in the range of from about 15° C. to about 75° C. The acidic solution 22 preferably has a pH in the range of from about 1 to about 5. Such condition of the acidic solution 22 optimally breaks bonds within the copper residue 20 on the semiconductor wafer 18.

Figure 3:
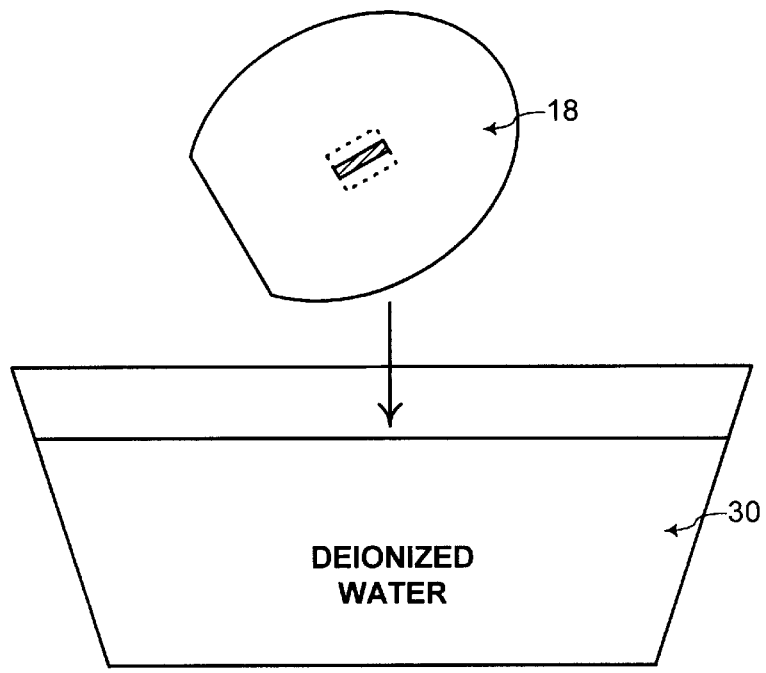
FIG. 3 shows the semiconductor wafer being immersed into deionized water after being immersed into the acidic solution of FIG. 2, according to the present invention.

Referring to FIG. 3, the semiconductor wafer 18 is then immersed into a first vat of deionized water 30 after having been immersed into the acidic solution 22. The semiconductor wafer 18 is rinsed in the first vat of deionized water 30 preferably for a time duration in the range of from about 1 second to about 5 seconds. The temperature of the first vat of deionized water 30 is preferably in the range of from about 15° C. to about 75° C.

The immersion of the semiconductor wafer 18 in the first vat of deionized water 30 after immersion into the acidic solution 22 rinses the acidic solution from the surfaces of the semiconductor wafer 18. In addition, a silicon dioxide ($SiO_2$) passivation layer is formed on the backside of the semiconductor wafer 18 when the semiconductor wafer 18 is a silicon wafer.

Figure 4:
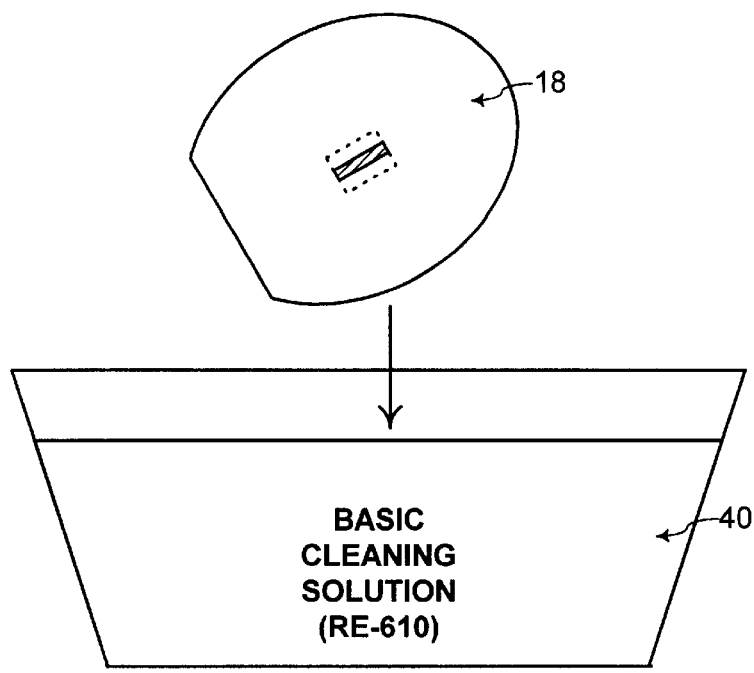
FIG. 4 shows the semiconductor wafer being immersed into a basic cleaning solution having special components for rinsing away the copper residue from the semiconductor wafer, according to the present invention.

Referring to FIG. 4, the semiconductor wafer 18 is then immersed into a basic cleaning solution 40. The cleaning solution 40 includes tetramethylammonium hydroxide (($CH_3$)$_4$NOH) and surfactant (RE-610) to wash away the copper residue 20 having broken bonds from the semiconductor wafer 18. The tetramethylammonium hydroxide (($CH_3$)$_4$NOH) has a concentration in the cleaning solution 40 in the range of from about 5 g/l to about 100 g/l. The surfactant (RE-610) has a concentration in the cleaning solution 40 in the range of from about 0.01 g/l to about 0.10 g/l. The solvent of the cleaning solution 40 is water ($H_2O$).

In an alternative embodiment of the present invention, the cleaning solution may include ammonium hydroxide ($NH_4OH$) having a concentration in the cleaning solution 40 in the range of from about 5 g/l to about 100 g/l instead of the tetramethylammonium hydroxide (($CH_3$)$_4$NOH).

The basic cleaning solution 40 having such a concentration of tetramethylammonium hydroxide (($CH_3$)$_4$NOH) and surfactant (RE-610) acts as an emulsifier and effectively rinses off the copper residue having broken bonds on the semiconductor wafer 18. The semiconductor wafer 18 is immersed in the cleaning solution 40 preferably for a time duration in the range of from about 1 minute to about 3 minutes. The temperature of the cleaning solution 40 preferably is in the range of from about 15° C. to about 95° C. The basic cleaning solution 40 preferably has a pH in the range of from about 7 to about 14. Such condition of the cleaning solution 40 optimally rinses the copper residue 20 having the broken bonds from the semiconductor wafer 18.

Figure 5:
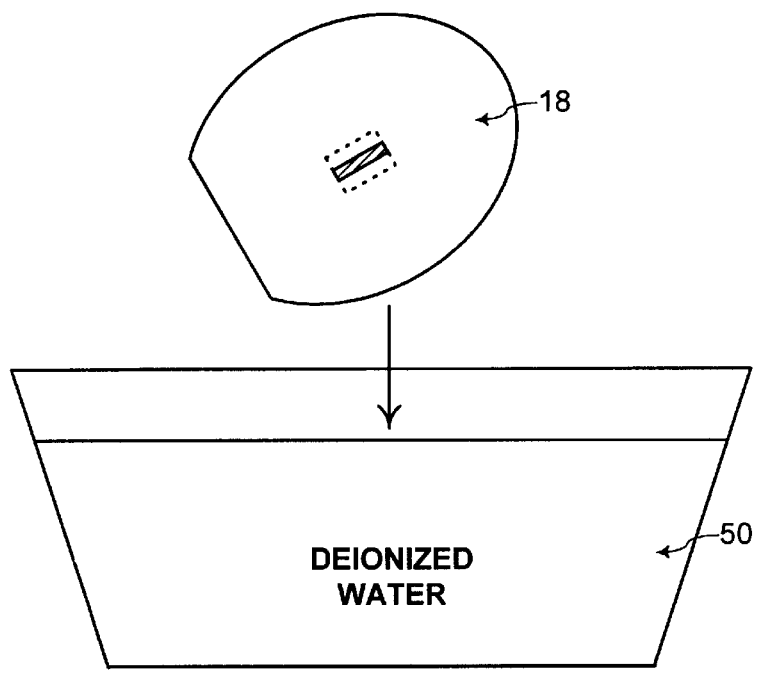
FIG. 5 shows the semiconductor wafer being immersed into deionized water after being immersed into the cleaning solution of FIG. 4, according to the present invention.

Referring to FIG. 5, the semiconductor wafer 18 is then immersed into a second vat of deionized water 50 after having been immersed into the cleaning solution 40. The semiconductor wafer 18 is rinsed in the second vat of deionized water 50 preferably for a time duration in the range of from about 1 minute to about 15 minutes. The temperature of the second vat of deionized water 50 is preferably in the range of from about 15° C. to about 75° C.

The immersion of the semiconductor wafer 18 in the second vat of deionized water 50 after immersion into the cleaning solution 40 rinses the cleaning solution from the surfaces of the semiconductor wafer 18. In addition, a silicon dioxide ($SiO_2$) passivation layer is formed on the backside of the semiconductor wafer 18 when the semiconductor wafer 18 is a silicon wafer.

In this manner, copper residue is effectively removed from the semiconductor wafer 18 after a chemical mechanical polish. By first immersing the semiconductor wafer in an acidic solution having hydrogen fluoride (HF) and hydrogen chloride (HCl), bonds within the copper residue are broken. Then by immersing the semiconductor wafer in a basic cleaning solution having tetramethylammonium hydroxide (($CH_3$)$_4$NOH) and surfactant (RE-610), the copper residue having broken bonds is effectively rinsed away from the semiconductor wafer 18. This two-step copper residue removal process more effectively removes copper residue from the semiconductor wafer 18 than just a rinsing of the semiconductor wafer in deionized water.

Cobalt was experimentally deposited by electroless process onto the top surface of the semiconductor wafer after the copper residue removal process of the present invention. Selective cobalt deposition formed only on the copper metal lines indicating that the copper residue was effectively removed from surfaces of the semiconductor wafer with the copper residue removal process of the present invention.

The foregoing is by way of example only and is not intended to be limiting. For example, the advantageous features of the present invention may be used when any type of copper residue is removed from the surface of any type of semiconductor wafer. Furthermore, as will be understood by those skilled in the art, the integrated circuit structures described herein may be made or used in the same way regardless of their position and orientation. Accordingly, it is to be understood that terms and phrases such as "backside" and "on top of" as used herein refer to the relative location and orientation of various portions of the structures with respect to one another, and are not intended to suggest that any particular absolute orientation with respect to external objects is necessary or required. The invention is limited only as defined in the following claims and equivalents thereof.

I claim:

1. A method for removing copper residue ingrained into a top portion of an insulating layer on a semiconductor wafer, said insulating layer being exposed on said semiconductor wafer, the method including the steps of:
    A. immersing said semiconductor wafer in an acidic solution for a first time period, said acidic solution including:
        hydrogen fluoride (HF) having a concentration in said acidic solution in the range of from about 50 ml/l to about 500 ml/l; and
        hydrogen chloride (HCl) having a concentration in said acidic solution in the range of from about 1 ml/l to about 20 ml/l,
    said semiconductor wafer being immersed in said acidic solution to break bonds in said copper residue;
    B. preserving a substantial portion of said insulating layer exposed on said semiconductor wafer by etching a thin portion at the top of said insulating layer to loosen said copper residue ingrained into said top portion of said insulating layer with control of said first time period of immersing said semiconductor wafer in said acidic solution to be less than about 15 seconds during said step A;
    C. immersing said semiconductor wafer in a cleaning solution for a second time period, said cleaning solution including:
        tetramethylammonium hydroxide $((CH_3)_4NOH)$ having a concentration in said cleaning solution in the range of from about 5 g/l to about 100 g/l; and
        surfactant (RE-610) having a concentration in said cleaning solution in the range of from about 0.01 g/l to about 0.10 g/l,
    said semiconductor wafer being immersed in said cleaning solution for removing copper residue having broken bonds after said step A from said semiconductor wafer; and
    D. preventing diffusion of copper from said copper residue into said insulating layer by substantially removing said copper residue loosened by said acidic solution from said top portion of said insulating layer while preserving a substantial portion of said insulating layer on said semiconductor wafer by controlling said second time period of immersing said semiconductor wafer in said cleaning solution in said step C to be at least 3 times greater than said first time period of immersing said semiconductor wafer in said acidic solution in said step A.

2. The method of claim 1, wherein said copper residue results from chemical mechanical polishing of said semiconductor wafer after copper deposition for formation of a copper metal line within a trench surrounded by said insulating layer.

3. The method of claim 2, wherein said copper residue includes copper ingrained within said insulating layer that is comprised of silicon dioxide $(SiO_2)$ exposed on said semiconductor wafer.

4. The method of claim 3, wherein said hydrogen fluoride and hydrogen chloride in said acidic solution break bonds in said copper residue also comprised of dicopper oxide, copper oxide, and organic copper residue.

5. The method of claim 1, wherein said acidic solution includes water $(H_2O)$ as the solvent of said acidic solution.

6. The method of claim 1, wherein said cleaning solution includes water $(H_2O)$ as the solvent of said cleaning solution.

7. The method of claim 1, wherein for step A, said semiconductor wafer is immersed in said acidic solution for a time duration in the range of from about 3 seconds to about 15 seconds.

8. The method of claim 1, wherein for step C, said semiconductor wafer is immersed in said cleaning solution for said second time period in the range of from about 1 minute to about 3 minutes.

9. The method of claim 1, wherein for step A, said semiconductor wafer is immersed in said acidic solution with a temperature of said acidic solution being in the range of from about 15° C. to about 75° C.

10. The method of claim 1, wherein for step C, said semiconductor wafer is immersed in said cleaning solution with a temperature of said cleaning solution being in the range of from about 15° C. to about 95° C.

11. The method of claim 1, wherein for step A, said semiconductor wafer is immersed in said acidic solution having a pH in the range of from about 1 to about 5.

12. The method of claim 1, wherein for step C, said semiconductor wafer is immersed in said cleaning solution having a pH in the range of from about 7 to about 14.

13. The method of claim 1, further including the step of:
    rinsing said semiconductor wafer in deionized water after said step A and before said step C.

14. The method of claim 13, wherein said semiconductor wafer is rinsed in said deionized water after said step A and before said step C for a time duration in the range of from about 1 second to about 5 seconds.

15. The method of claim 13, wherein said semiconductor wafer is rinsed in said deionized water after said step A and before said step C with a temperature of said deionized water being in the range of from about 15° C. to about 75° C.

16. The method of claim 1, further including the step of:
    rinsing said semiconductor wafer in deionized water after said step C.

17. The method of claim 16, wherein said semiconductor wafer is rinsed in said deionized water after said step C for a time duration in the range of from about 1 minute to about 15 minutes.

18. The method of claim 16, wherein said semiconductor wafer is rinsed in said deionized water after said step C with a temperature of said deionized water being in the range of from about 15° C. to about 75° C.

19. A method for removing copper residue ingrained into a top portion of an insulating layer on a semiconductor wafer, said copper residue resulting from chemical mechanical polishing of said semiconductor wafer and said copper residue being comprised of copper ingrained within said insulating layer being exposed on said semiconductor wafer and being comprised of silicon dioxide ($SiO_2$), said copper residue also being comprised of dicopper oxide ($Cu_2O$), copper oxide (CuO), and organic copper residue, the method including the steps of:

A. immersing said semiconductor wafer in an acidic solution for a first time period in the range of from about 3 seconds to about 15 seconds and with a temperature of said acidic solution being in the range of from about 15° C. to about 75° C., said acidic solution having a pH in the range of from about 1 to about 5, and said acidic solution including:

hydrogen fluoride (HF) having a concentration in said acidic solution in the range of from about 50 ml/l to about 500 ml/l;

hydrogen chloride (HCl) having a concentration in said acidic solution in the range of from about 1 ml/l to about 20 ml/l; and water ($H_2O$) as the solvent of said acidic solution, said semiconductor wafer being immersed in said acidic solution to break bonds in said copper residue;

B. preserving a substantial portion of said insulating layer exposed on said semiconductor wafer by etching with said acidic solution a thin portion at the top of said insulating layer to loosen said copper residue ingrained into said top portion of said insulating layer with control of said first time period of immersing said semiconductor wafer in said acidic solution to be less than about 15 seconds in said step A;

C. rinsing said semiconductor wafer in deionized water after said step A for a time duration in the range of from about 1 second to about 5 seconds and with a temperature of said deionized water being in the range of from about 15° C. to about 75° C.;

D. immersing said semiconductor wafer in a cleaning solution for a second time period in the range of from about 1 minute to about 3 minutes and with a temperature of said cleaning solution being in a range from about 15° C. to about 95° C., said cleaning solution having a pH in the range of from about 7 to about 14, and said cleaning solution including:

tetramethylammonium hydroxide ($(CH_3)_4NOH$) having a concentration in said cleaning solution in the range of from about 5 g/l to about 100 g/l;

surfactant (RE-610) having a concentration in said cleaning solution in the range of from about 0.01 g/l to about 0.10 g/l; and water ($H_2O$) as the solvent of said cleaning solution, said semiconductor wafer being immersed in said acidic solution for removing copper residue having broken bonds after said step C from said semiconductor wafer;

E. preventing diffusion of copper from said copper residue into said insulating layer by substantially removing said copper residue loosened by said acidic solution from said top portion of said insulating layer while preserving a substantial portion of said insulating layer on said semiconductor wafer in said step D by controlling said second time period of immersing said semi-conductor wafer in said cleaning solution in said step D to be at least 3 times greater than said first time period of immersing said semiconductor wafer in said acidic solution in said step A; and F. rinsing said semiconductor wafer in deionized water after said step D for a time duration in the range of from about 1 minute to about 15 minutes and with a temperature of the deionized water being in the range of from about 15° C. to about 75° C.

20. A method for removing copper residue ingrained into a top portion of an insulating layer on a semiconductor wafer, said insulating layer being exposed on said semiconductor wafer, the method including the steps of:

A. immersing said semiconductor wafer in an acidic solution for a first time period, said acidic solution including:

hydrogen fluoride (HF) having a concentration in said acidic solution in the range of from about 50 ml/l to about 500 ml/l; and hydrogen chloride (HCl) having a concentration in said acidic solution in the range of from about 1 ml/l to about 20 ml/l, said semiconductor wafer being immersed in said acidic solution to break bonds in said copper residue;

B. preserving a substantial portion of said insulating layer on said semiconductor wafer by etching with said acidic solution a thin portion at the top of said insulating layer to loosen said copper residue ingrained into said top portion of said insulating layer with control of said first time period of immersing said semiconductor wafer in said acidic solution to be less than about 15 seconds in said step A;

C. immersing said semiconductor wafer in a cleaning solution for a second time period, said cleaning solution including:

ammonium hydroxide ($NH_4OH$) having a concentration in said cleaning solution in the range of from about 5 g/l to about 100 g/l; and surfactant (RE-610) having a concentration in said cleaning solution in the range of from about 0.01 g/l to about 0.10 g/l, said semiconductor wafer being immersed in said cleaning solution for removing copper residue having broken bonds after said step A from said semiconductor wafer; and D. preventing diffusion of copper from said copper residue into said insulating layer by substantially removing said copper residue loosened by said acidic solution from said top portion of said insulating layer while preserving a substantial portion of said insulating layer on said semiconductor wafer during said step C, by controlling said second time period of immersing said semiconductor wafer in said cleaning solution in said step C to be at least 3 times greater than said first time period of immersing said semiconductor wafer in said acidic solution in said step A.

* * * * *